United States Patent

[11] 3,621,280

[72] Inventor Stephen P. F. Ma
Santa Monica, Calif.

[21] Appl. No. 27,273
[22] Filed Apr. 10, 1970
[45] Patented Nov. 16, 1971
[73] Assignee Hughes Aircraft Company
Culver City, Calif.

[54] MOSFET ASYNCHRONOUS DYNAMIC BINARY COUNTER

3 Claims, 2 Drawing Figs.

[52] U.S. Cl. .......... 307/225, 307/208, 307/251, 307/279, 328/48
[51] Int. Cl. .......... H03k 3/26
[50] Field of Search .......... 307/205, 208, 220, 221, 221 C, 225, 251, 279, 304; 328/48

[56] References Cited

UNITED STATES PATENTS

| | | | |
|---|---|---|---|
| 3,500,064 | 3/1970 | Wong | 307/279 X |
| 2,877,357 | 3/1959 | Pearsall, Jr. et al. | 307/221 |
| 3,290,606 | 12/1966 | Rodner | 307/220 X |
| 3,299,285 | 1/1967 | Cannon | 307/208 X |
| 3,322,974 | 5/1967 | Ahrons et al. | 307/208 X |
| 3,493,785 | 2/1970 | Rapp | 307/279 |
| 3,458,825 | 7/1969 | Lagemann | 307/208 X |

*Primary Examiner*—Stanley T. Krawczewicz
*Attorneys*—James K. Haskell and Bernard P. Drachlis ABSTRACT: A dynamic binary counter which operates in an asynchronous manner and which can be constructed on a single semiconductor substrate with metal oxide semiconductor field effect transistor (MOSFET) techniques. The counter stages are constructed from three MOSFET inverters and associated gating MOSFET's to take advantage of the capacitance characteristics of the gates of the MOSFET transistors.

INVENTOR.
STEPHEN P. F. MA,
BY
Bernard P. Drachlis
ATTORNEY.

MOSFET ASYNCHRONOUS DYNAMIC BINARY COUNTER

BACKGROUND OF THE INVENTION

This invention relates generally to semiconductor circuits and more particularly to an asynchronous dynamic binary counter circuit constructed using metal oxide semiconductors field effect transistor (MOSFET) techniques.

MOSFET circuits have been used in the past to construct counters. However, common prior art devices utilize flip-flops in a master /slave configuration. This requires two flip-flops for each stage of the counter. One known prior art device requires 16 MOS transistors per bit for the master/slave flip-flop circuit.

SUMMARY OF THE INVENTION

The present invention is an asynchronous dynamic binary counter constructed by metal oxide semiconductor field effect transistor (MOSFET) techniques on a monolithic semiconductor substrate. More particularly, the dynamic counter of this invention utilizes three MOSFET inverters and associated gating MOSFETS's and the capacitance characteristics of the gates of the MOS transistors for the dynamic information storage. This results in a saving of several transistors per stage over prior art techniques, which is very important for integrated circuits.

The counter includes a series of identical stages, one stage being associated with each bit. A reset pulse is applied to each stage to initialize the counter. Clock pulse and inverted clock pulse signals are applied to the true and false inputs, respectively, of the first stage of the counter. The true and false outputs of each stage are applied to the succeeding stage and act as the true and false inputs, respectively, for the succeeding stage.

DESCRIPTION OF THE DRAWINGS

The above and other novel features and advantages of the invention will become more apparent from the following detailed description when taken in conjunction with the accompanying drawings, in which.

DESCRIPTION OF THE PREFERRED EMBODIMENT

The invention will be described in terms of a negative logic system where ground voltage level indicates a logic 0 and a relatively negative voltage level indicates a logic 1. It will be clear to those skilled in the art that a positive logic system could be used with appropriate changes in the supply voltages applied to the circuitry of an enhancement mode P-type substrate. All parts of the circuit can be constructed on one semiconductor substrate using standard MOSFET techniques. The MOSFET circuit is constructed to operate in the enhancement mode with an N-type substrate. This means that for a MOSFET to conduct, the gate voltage will be negative with respect to the source voltage. The logic levels used for the circuits are ground to indicate a logic 0 and a negative voltage which may be −15 v., for example, to indicate a logic 1. The drain supply voltage $-V_{DD}$ is at the logic 1 voltage level. The gate supply voltage $-V_{GG}$ for the MOS field control resistors is more negative than $-V_{DD}$ and may be at −30 v., for example. This means that for a MOSFET to conduct, a logic 1 ($-V_{DD}$) will be applied to the gate of the MOSFET.

Figure 1:
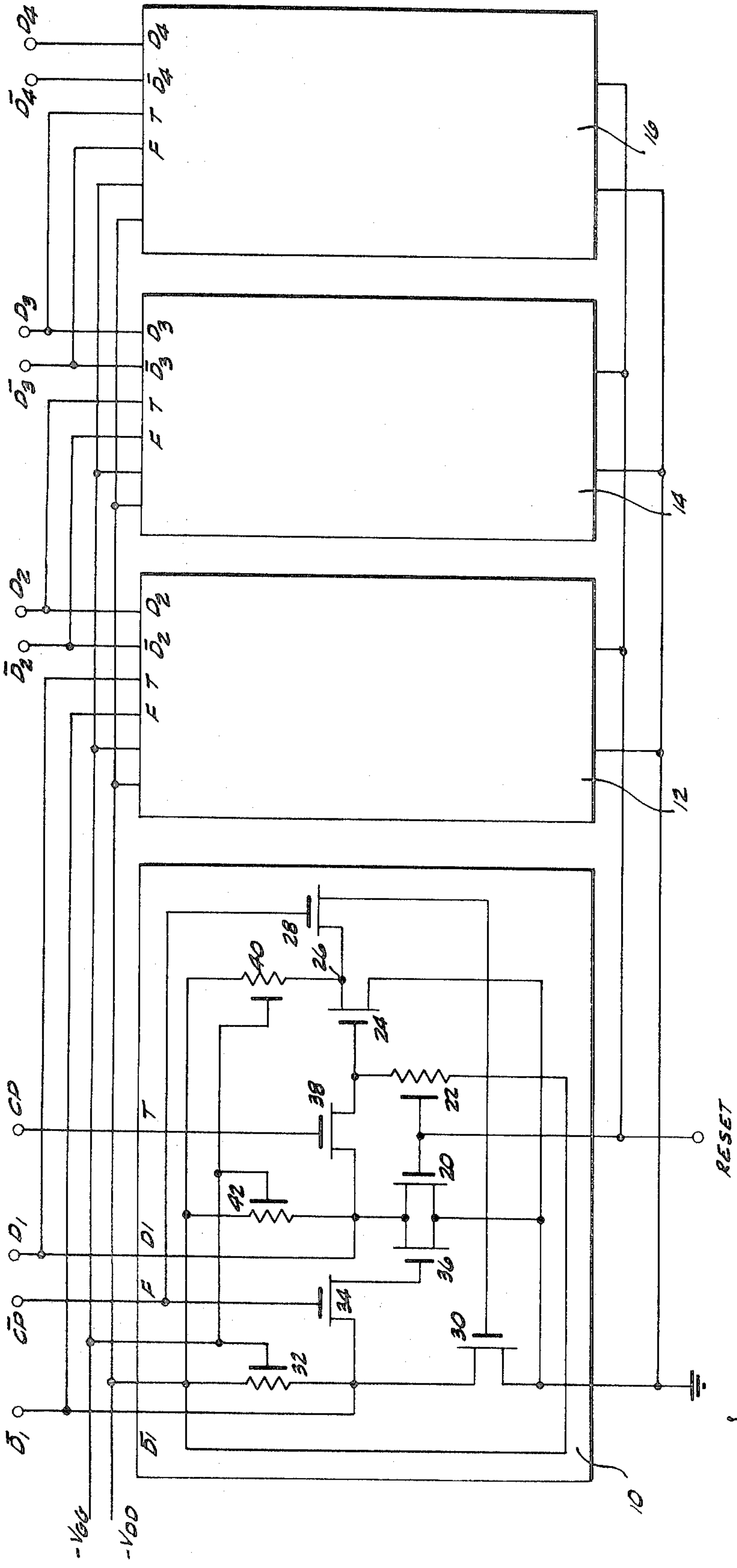
FIG. 1 is a diagram illustrating the synchronous dynamic binary counter of the present invention.

Referring now to the drawings, FIG. 1 shows a four-bit binary counter constructed by the techniques of the present invention. The counter includes four stages—10, 12, 14 and 16. The detailed circuitry of the first stage is shown. Each of the other stages is substantially identical to the first stage.

Figure 2:
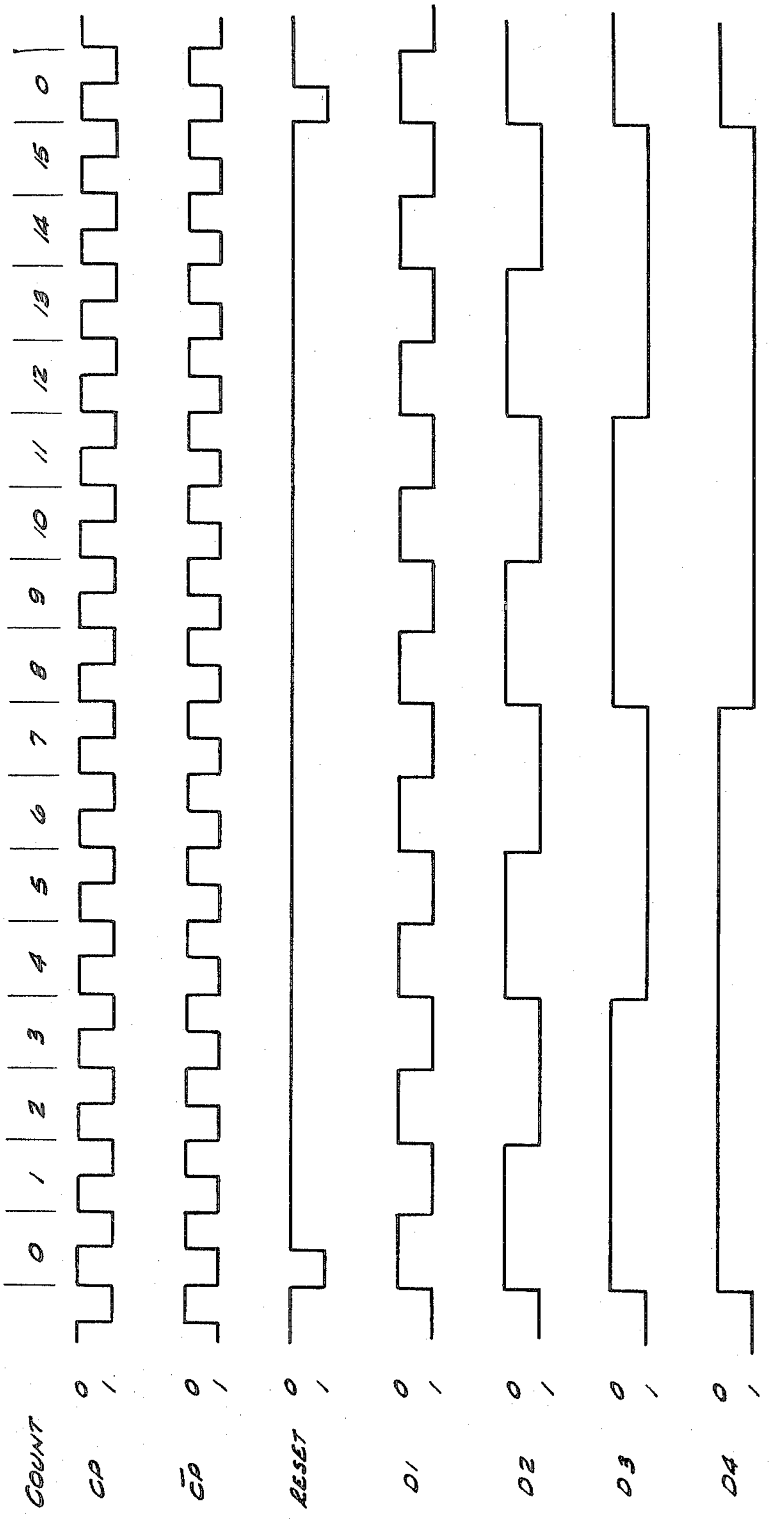
FIG. 2 is a graph illustrating the signal waveforms associated with the operation of the counter illustrated in FIG. 1.

The drain supply voltage $-V_{DD}$ and the gate supply voltage $-V_{GG}$ for the MOS field controlled resistors are applied to each stage of the counter. Similarly, ground voltage is applied to each stage of the counter. A RESET signal is applied to each stage of the counter and will initialize each stage to a reset condition. The counter stages are simultaneously initialized when the RESET signal goes to logic 1. This is shown by the waveform labeled RESET in FIG. 2. In the waveform diagram of FIG. 2, the higher level indicates logic 0 and the lower level indicates logic 1, since the system is being described in terms of negative logic.

A clock pulse signal CP and an inverted clock pulse signal $\overline{CP}$ are applied to the true and false inputs, T and F, respectively, of the first stage. These signals are shown as the complementary rectangular waveforms CP and $\overline{CP}$ respectively in FIG. 2.

The true and false output signals of the first stage 10 of the counter are D1 and $\overline{D1}$ respectively. The signals D1 and $\overline{D1}$ will have complementary waveforms. The true output signal D1 is shown as the waveform labeled D1 in FIG. 2. The second stage 12 of the counter is substantially identical to the first stage of the counter. The true and false outputs D1 and $\overline{D1}$ respectively of the first stage 10 are applied to the true and false inputs of the second stage 12 of the counter. The true and false outputs of the second stage 12 of the counter are D2 and $\overline{D2}$ respectively and are applied to the true and false inputs of the third stage 14 of the counter. The signals D2 and $\overline{D2}$ will have complementary waveforms. The true output D2 is shown as the waveform labeled D2 in FIG. 2. The true and false outputs of the third stage 14 of the counter are D3 and $\overline{D3}$ respectively and are applied to the true and false inputs of the fourth stage 16 of the counter. The signals D3 and $\overline{D3}$ will have complementary waveforms. The true output D3 is shown as the waveform labeled D3 in FIG. 2. The true and false outputs of the fourth stage 16 of the counter are D4 and $\overline{D4}$ respectively. The signals D4 and $\overline{D4}$ will have complementary waveforms. The true output D4 is shown as the waveform labeled D4 in FIG. 2.

Each stage has three MOSFET inverters and three gating MOSFET's interconnected in a recirculating arrangement. There is also one MOSFET AND A MOS field-controlled resistor used to set initial conditions for each stage. A detailed circuit diagram is shown in FIG. 1 for the first stage 10. A MOSFET 36 is interconnected with a MOS field-controlled resistor 42 to form a first MOSFET inverter. The gate of MOSFET 36 is the input to the inverter. The common interconnection of MOSFET 36 and MOS field-controlled resistor 42 is the output of the inverter which is connected to the true output D1 of the counter stage. A MOSFET 24 is interconnected with a MOS field-controlled resistor 40 to form a second MOSFET inverter. The gate of MOSFET 24 is the input to the inverter. The common interconnection of MOSFET 24 and MOS field-controlled resistor 40 is the output of the inverter. A MOSFET 30 is interconnected with a MOS field-controlled resistor 32 to form a third MOSFET Inverter. The gate of MOSFET 30 is the input to the inverter. The common interconnection of MOSFET 30 and MOS field-controlled resistor 32 is the output of the inverter which is connected to the false output $\overline{D1}$ of the counter stage.

A gating MOSFET 38 has its signal terminals connected between the output of the first MOSFET inverter and the input to the second MOSFET inverter and has it gate terminal connected to the clock pulse signal CP. A gating MOSFET 28 has its signal terminals connected between the output of the second MOSFET inverter and the input to the third MOSFET inverter and has its gate terminal connected to the inverted clock pulse signal $\overline{CP}$. A gating MOSFET 34 has its signal l terminals connected between the output of the third MOSFET inverter and the input to the first MOSFET inverter and has its gate terminal connected to the inverted clock pulse signal $\overline{CP}$.

The first stage 10 further includes a MOSFET 20 having its signal terminals connected in parallel with the MOSFET 36 and having its gate terminal connected to the reset input. A MOS field-controlled resistor 22 is connected between $-V_{DD}$ and the gate of the MOSFET 24 and has its gate terminal connected to the reset input.

The detailed operation of the first stage will now be described. The first stage requires two half cycles to switch output conditions. The first half-cycle is with $\overline{CP}$ at logic 1 and CP at ground. The second half-cycle is with $\overline{CP}$ at ground and CP at logic 1. The RESET pulse is applied to the gate of a MOSFET 20 and to the gate of a MOS field-controlled resistor 22. Logic 0 (ground) is applied to the source of the MOSFET 20. When the gate of the MOSFET 20 goes to logic 1, the MOSFET 20 will conduct and the true output D1 of the counter stage 10 D1 will go to logic 0. When logic 1 is applied to the gate of the MOS field-controlled resistor 22, the resistor will conduct and logic 1 ($-V_{DD}$) will be applied to the gate of a MOSFET 24. This will allow the MOSFET 24 to conduct and logic 0 will appear at junction 26. At the time the RESET pulse is logic 1, the inverted clock pulse $\overline{CP}$ is also at logic 1. $\overline{CP}$ is applied to the gate of a MOSFET 28. This will allow MOSFET 28 to conduct and the logic 0 signal at junction 26 will be applied to the gate of a MOSFET 30. This will prevent the MOSFET 30 from conducting. Logic 1 ($-V_{DD}$) will show through the MOS field-controlled resistor 32 to the false output terminal $\overline{D1}$.

The inverted clock pulse $\overline{CP}$ is also applied to the gate of a MOSFET 34 and will allow the MOSFET 34 to conduct the logic 1 signal $\overline{D1}$ through its signal terminals to the gate of a MOSFET 36. This will allow MOSFET 36 to conduct and provide a second path for logic 0 at the D1 output. The MOSFET 36 conducting is consistent with the MOSFET 20 conducting. This completes the initial condition in response to the RESET pulse. This is also the completion of one half-cycle and keeps point D1 at ground.

The second half-cycle for switching of the first stage is when $\overline{CP}$ goes to logic 0 and CP goes to logic 1. At this time the RESET signal will return to logic 0 and will remain there until the counter is to be initialized again. With the RESET signal at logic O, logic 0 will be applied to the gate of MOSFET 20 and MOSFET 20 will not conduct. Logic 0 is also applied to the gate of the MOS field-controlled resistor 22 and the resistor 22 will now act as an open circuit. Since $\overline{CP}$ has gone to logic 0, MOSFET 34 will be turned off. The gate of MOSFET 36, however, will remain at logic 1 until the next half cycle due to the delay from the capacitance characteristics of the gate of MOSFET 36. This will maintain a conducting path to logic 0 for output D1. The clock pulse signal CP is at logic 1 and is applied to the gate of a MOSFET 38. This will allow MOSFET 38 to conduct and logic 0 will be applied from output D1 to the gate of MOSFET 24. This will turn off MOSFET 24 and allow logic 1 ($-V_{DD}$) to show through a MOS field-controlled resistor 40 to junction 26. Also, since $\overline{CP}$ has gone to logic 0, MOSFET 28 will be turned off. The gate of MOSFET 30 will remain at logic 0. This will keep the MOSFET 30 from conducting and output $\overline{D1}$ will remain at logic 1. Two half-cycles have now been completed.

The third half-cycle will now begin. $\overline{CP}$ will go to logic 1 and CP will go to logic 0. RESET signal will remain at logic 0. Since $\overline{CP}$ is at logic 1, logic 1 will be applied to the gate of MOSFET 34 and MOSFET 34 will be turned on. Logic 1 will also be applied to the gate of MOSFET 28 and MOSFET 28 will be turned on. Since CP is at logic, 0, MOSFET 38 will be turned off. The gate of MOSFET 24 will remain at logic 0. This will keep junction 26 at logic 1. Now, since MOSFET 28 is turned on, logic 1 will be applied through its signal terminals to the gate of MOSFET 30. MOSFET 30 will conduct and bring output $\overline{D1}$ to logic 0. Since MOSFET 34 is on, logic 0 will conduct from output D1 to the gate of MOSFET 36. This will turn off MOSFET 36. Now, since there is no path to logic 0 for output D1, logic 1 ($-V_{DD}$) will show through a MOS field-controlled resistor 42 and bring output D1 to logic 1. Recall that MOSFET 20 will remain off. Since CP is at logic 0, MOSFET 38 will remain off and output D1 will not affect the gate of MOSFET 24. This completed the third half-cycle.

For the fourth half-cycle, $\overline{CP}$ goes to logic 0 and CP goes to logic 1. The RESET signal remains at logic 0. Since CP is at logic 1, MOSFET 38 will be turned on and logic 1 from output D1 will be applied to the gate of MOSFET 24. Also, since $\overline{CP}$ is at logic 0, MOSFET 34 will be turned off. The gate of MOSFET 36 will remain at logic 0 and output D1 will remain at logic 1. Since logic 1 is now applied to the gate of MOSFET 24, MOSFET 24 will be turned on and point 26 will go to logic 0. MOSFET 28 will be off because $\overline{CP}$ is at logic 0 and the ground signal at point 26 will not be applied to the gate of MOSFET 30. The gate of MOSFET 30 will remain at logic 1 until the next half-cycle due to the delay from the capacitance characteristics of the gate of the MOSFET. MOSFET 30 will remain on and output $\overline{D1}$ will remain at logic 0. Since $\overline{CP}$ is at logic 0, MOSFET 34 will be turned off and the logic 0 signal from output $\overline{D1}$ will not be applied to the gate of MOSFET 36. This completes the fourth half-cycle. At this point, the first half-cycle will repeat.

The detailed operation of the succeeding stages is identical to the first stage with the outputs of the preceding stage acting as the clock pulse inputs. The counter may be extended to any practical number of stages by adding identical stages and connecting them in the same manner as that shown in FIG. 1. In practice, the limit on the number of stages will be the frequency of the slowest stage in the counter. This is due to the capacitance storage characteristics of the circuitry. The practical limit for typical MOSFET circuits is about 5 kHz. for the frequency of the slowest stage. A practical upper limit for the frequency of the first stage of the counter is approximately 2 mhz. This again is due to the capacitance storage characteristics of typical MOSFET circuitry.

Another practical consideration for the number of stages in a particular counter is the accumulative delay in each stage since the counter operates asynchronously. The delay characteristics will depend upon the specific configuration of the MOSFET circuitry and as long as the delay in counting through the counter is acceptable for the use to which the counter will be put, the technique of the present invention can be used.

The RESET signal may be used to reset the counter at any time during its count without waiting for the counter to reach a full count. The only restriction is that the RESET signal should go to logic 1 at the same time that $\overline{CP}$ is at logic 1.

What is claimed is:

1. An asynchronous dynamic binary counter of the type that can be constructed on a monolithic semiconductor substrate by metal oxide semiconductor field effect transistor techniques, having a series of MOSFET counter stages, each being coupled to receive a true input signal and a false input signal, for providing a true output signal and a false output signal; the first of the series of MOSFET counter stages coupled to receive complementary input signals as is true and false input signals; and each succeeding MOSFET counter stage coupled to receive the true and false output signals of the next preceding MOSFET counter stage as its true and false input signals, respectively, wherein each of said MOSFET counter stages comprises:

a first MOSFET inverter having an input and providing and inverted output signal, which is the true output signal;

a first gating MOSFET having a first signal terminal coupled to receive the inverted output signal of said first MOSFET inverter, a second signal terminal, and a gate terminal coupled to receive the true input signal;

a second MOSFET inverter having an input coupled to the second signal terminal of said first gating MOSFET and providing an inverted output signal;

a second gating MOSFET having a first signal terminal coupled to receive the inverted output of said second MOSFET inverter, a second signal terminal, and a gate terminal coupled to receive the false input signal;

a third MOSFET inverter having an input coupled to the second signal terminal of said second gating MOSFET and providing an inverted output signal which is the false output signal; and a third gating MOSFET having a first signal terminal coupled to receive the inverted output signal of said third MOSFET inverter, a second signal terminal coupled to the input of said first MOSFET inverter, and a gate terminal coupled to receive the false input signal.

2. A dynamic storage element of the type that can be constructed on a monolithic semiconductor substrate by metal oxide semiconductors field effect transistor techniques operable to receive a first input signal, a second input signal being complementary to said first input signal, and a reset signal, each of said signals having a true state and false state, and to provide a first output signal and a second output signal being complementary to said first output signal, each of said signals having a true state and a false state, said dynamic storage element comprising:

a first MOSFET inverter having an input and providing an inverted output signal, which is the first output signal;

a first gating MOSFET having a first signal terminal coupled to receive the inverted output signal of said first MOSFET inverter, a second signal terminal, and a gate terminal coupled to receive the first input signal;

a second MOSFET inverter having an input coupled to the second signal terminal of said first gating MOSFET and providing an inverted output signal;

a second gating MOSFET having a first signal terminal coupled to receive the inverted output signal of said second MOSFET inverter, a second signal terminal, and a gate terminal coupled to receive the second input signal;

a third MOSFET inverter having an input coupled to the second signal terminal of said second gating MOSFET and providing an inverted output signal which is the second output signal;

a third gating MOSFET having a first signal terminal coupled to receive the inverted output signal of said third MOSFET inverter, a second signal terminal coupled to the input of said first MOSFET inverter, and a gate terminal coupled to receive the second input signal; and means for placing the output of said first MOSFET inverter to a false state and the input of said second MOSFET inverter to a true state in response to the reset signal.

3. A dynamic storage element as claimed in claim 2 wherein said means for placing the output of said first MOSFET inverter to a false state and the input of said second MOSFET inverter to a true state in response to the reset signal comprises:

a gating MOSFET having its gate terminal coupled to the reset signal and having its signal terminal coupled to conduct a false state indicating voltage to the output of said first MOSFET inverter in response to the reset signal; and a MOS field-controlled resistor having its gate terminal coupled to the reset signal and having its signal terminals coupled to conduct a true state indicating voltage to the input of said second MOSFET inverter in response to the reset signal.

* * * * *